United States Patent
Jin et al.

(10) Patent No.: US 9,831,777 B2
(45) Date of Patent: Nov. 28, 2017

(54) SWITCH CONTROL CIRCUIT AND CONVERTER INCLUDING THE SAME

(71) Applicant: FAIRCHILD KOREA SEMICONDUCTOR LTD., Bucheon-si (KR)

(72) Inventors: Chenghao Jin, Bucheon-si (KR); SangCheol Moon, Daejeon (KR); Bonggeun Chung, Incheon (KR); Gwanbon Koo, Bucheon-si (KR)

(73) Assignee: Fairchild Korea Semicondcutor Ltd., Bucheon (KR)

( * ) Notice: Subject to any disclaimer, the term of this patent is extended or adjusted under 35 U.S.C. 154(b) by 0 days.

(21) Appl. No.: 15/196,483

(22) Filed: Jun. 29, 2016

(65) Prior Publication Data

US 2016/0380533 A1    Dec. 29, 2016

Related U.S. Application Data (60) Provisional application No. 62/185,834, filed on Jun. 29, 2015.

(51) Int. Cl.
| | |
|---|---|
| H02M 3/158 | (2006.01) |
| G01R 19/04 | (2006.01) |
| H02M 1/36 | (2007.01) |
| H02M 3/156 | (2006.01) |
| H02M 1/44 | (2007.01) |
| H02M 7/04 | (2006.01) |
| H02M 1/00 | (2006.01) |
| H02M 7/217 | (2006.01) |

(52) U.S. Cl.
CPC ............ *H02M 3/158* (2013.01); *G01R 19/04* (2013.01); *H02M 1/36* (2013.01); *H02M 1/44* (2013.01); *H02M 3/156* (2013.01); *H02M 7/04* (2013.01); *H02M 7/217* (2013.01); *H02M 2001/0009* (2013.01)

(58) Field of Classification Search
CPC .............................. H02M 3/156; H02M 1/08
See application file for complete search history.

(56) References Cited

U.S. PATENT DOCUMENTS

| 8,644,041 B2 * | 2/2014 | Pansier ............... H02M 1/4225 323/299 |
| 9,578,702 B2 * | 2/2017 | Siessegger ......... H05B 33/0818 |
| 2014/0056039 A1 * | 2/2014 | Laletin .................. H02M 7/062 363/45 |

* cited by examiner

*Primary Examiner* — Emily P Pham
(74) *Attorney, Agent, or Firm* — Okamoto & Benedicto LLP (57) ABSTRACT

Provided is a buck converter. The converter includes a power switch configured to receive and switch an input voltage and convert the input voltage into an output voltage, and a switch control circuit configured to generate a signal having a frequency synchronized with the input voltage, compensate for the signal by using an edge threshold voltage in an edge area of the signal according to at least one of a load state and the input voltage, and control switching of the power switch by using a result of comparing the signal with a band voltage corresponding to the output.

21 Claims, 7 Drawing Sheets

FIG. 7

SWITCH CONTROL CIRCUIT AND CONVERTER INCLUDING THE SAME

CROSS-REFERENCE TO RELATED APPLICATIONS

This application claims priority from U.S. Provisional Application No. 62/185,834, filed on Jun. 29, 2015 with the United States Patent and Trademark Office, the entire contents of which are incorporated herein by reference.

BACKGROUND (a) Technical Field

Embodiments of the present invention relate to a switch control circuit including a burst mode control circuit and a converter including the switch control circuit.

(b) Description of the Related Art

When a power switch of a converter switches during one cycle of an alternating current (AC) input which is input to the converter, a switching loss may be increased. For example, switching in a period in which the AC input is a high voltage increases the switching loss.

Switching may occur only in a predetermined period in one cycle of the AC input according to a required load. For example, under a light load condition, switching may occur only in a predetermined period around a zero-crossing time of the AC input.

Under a no-load condition, the converter operates in a burst mode, and it is necessary to appropriately set a burst bundle frequency in order to reduce the switching loss in the burst mode. A burst bundle frequency refers to a frequency in which a period in which switching occurs in the burst mode is generated.

SUMMARY

The present invention is directed to a switch control circuit including a burst mode control circuit and a converter including the switch control circuit.

According to an aspect of the present invention, there is provided a circuit for controlling switching of a converter. The circuit may include a signal generator configured to generate a signal having a frequency synchronized with an input voltage of the converter, and compensate for the signal by using an edge threshold voltage in an edge area of the signal according to at least one of a load state and the input voltage, and a switching phase generator configured to compare the signal with a band voltage based on an output of the converter.

The edge area may include a left edge area and a right edge area in the one cycle of the input voltage, and the signal generator may generate the signal as the edge threshold voltage in at least one area of the left edge area and the right edge area.

The signal generator may generate the signal as the same edge threshold voltage in the left edge area and the right edge area.

The signal generator may generate the signal as different edge threshold voltages in the left edge area and the right edge area.

At least one of the different edge threshold voltages may be lower than the band voltage.

The signal generator may compensate for the edge area of the signal by using the edge threshold voltage during m compensation cycles, and may not compensate for the edge area of the signal during k non-compensation cycles, in units of n cycles of the signal, where n=m+k, and n, m, and k may be natural numbers.

The signal generator may compensate for at least one of two edge areas in cycle of the signal by using the edge threshold voltage during the m compensation cycles.

The switching phase generator may enable a switching phase signal during a period in which the signal is lower than the band voltage.

The switching phase generator may enable the switching phase signal during a period in which the signal is lower than the band voltage and the input voltage is higher than the output voltage of the converter.

The edge threshold voltage may be higher than the band voltage.

According to another aspect of the present invention, there is provided a circuit for controlling switching of a converter. The circuit may include a signal generator configured to generate a signal having a frequency synchronized with an input voltage of the converter, and a switching phase generator configured to generate switching during a preliminary switching period that is not a blank period and during which the signal is lower than a band voltage corresponding to a difference between an output voltage and a predetermined voltage and is higher than the predetermined voltage.

The switching phase generator may generate switching from a time at which a blank period has elapsed after the signal is increased to reach the predetermined voltage to a first time at which the signal reaches the band voltage.

The switching phase generator may generate switching from a time at which the blank period has elapsed after the signal is decreased from a peak time of the signal and the first period has elapsed to a time at which the signal reaches the predetermined voltage, and the first period may be the same period as a period from the first time to the peak time.

According to still another aspect of the present invention, there is provided a converter. The converter may include a power switch configured to switch and convert an input voltage into an output, and a switch control circuit configured to generate a signal having a frequency synchronized with the input voltage, compensate for the signal by using an edge threshold voltage in an edge area of the signal according to at least one of a load state and the input voltage, and control switching of the power switch based on a result of comparing the signal with a band voltage corresponding to the output.

The edge area may include a left edge area and a right edge area in each cycle of the input voltage, and the burst mode control circuit may generate the signal as the edge threshold voltage in at least one area of the left edge area and the right edge area.

The burst mode control circuit may generate the signal as the same edge threshold voltage in the left edge area and the right edge area.

The burst mode control circuit may generate the signal as different edge threshold voltages in the left edge area and the right edge area.

At least one of the different edge threshold voltages may be lower than the band voltage.

The burst mode control circuit may compensate for the edge area of the signal by using the edge threshold voltage during m compensation cycles, and may not compensate for the edge area of the signal during k non-compensation cycles, in units of n cycles of the signal, where n=m+k, and n, m, and k may be natural numbers.

The burst mode control circuit may compensate for at least one of two edge areas in cycle of the signal by using the edge threshold voltage during the m compensation cycles.

The present invention provides a burst mode control circuit and a converter including the same.

DETAILED DESCRIPTION OF THE EMBODIMENTS

Hereinafter, embodiments that are easily performed by those skilled in the art will be described in detail with reference to the accompanying drawings. However, embodiments of the present invention may be implemented in several different forms, and are not limited to the embodiments described herein. In addition, parts irrelevant to the description are omitted in the drawings in order to clearly explain embodiments of the present invention. Similar parts are denoted by similar reference numerals throughout this specification.

Throughout this specification, when a part is referred to as being "connected" to another part, the part may be "directly connected" or "electrically connected" via an intervening part. Also, when a certain part "includes" a certain component, this does not exclude other components from being included unless described otherwise, and other components may in fact be included.

A burst mode control circuit according to an embodiment of the present invention compensates for a triangular wave synchronized with an input voltage, and determines a burst bundle frequency based on a result of comparing the compensated triangular wave and a band voltage corresponding to an output voltage. Hereinafter, the embodiment will be described with reference to the drawings.

Figure 1:
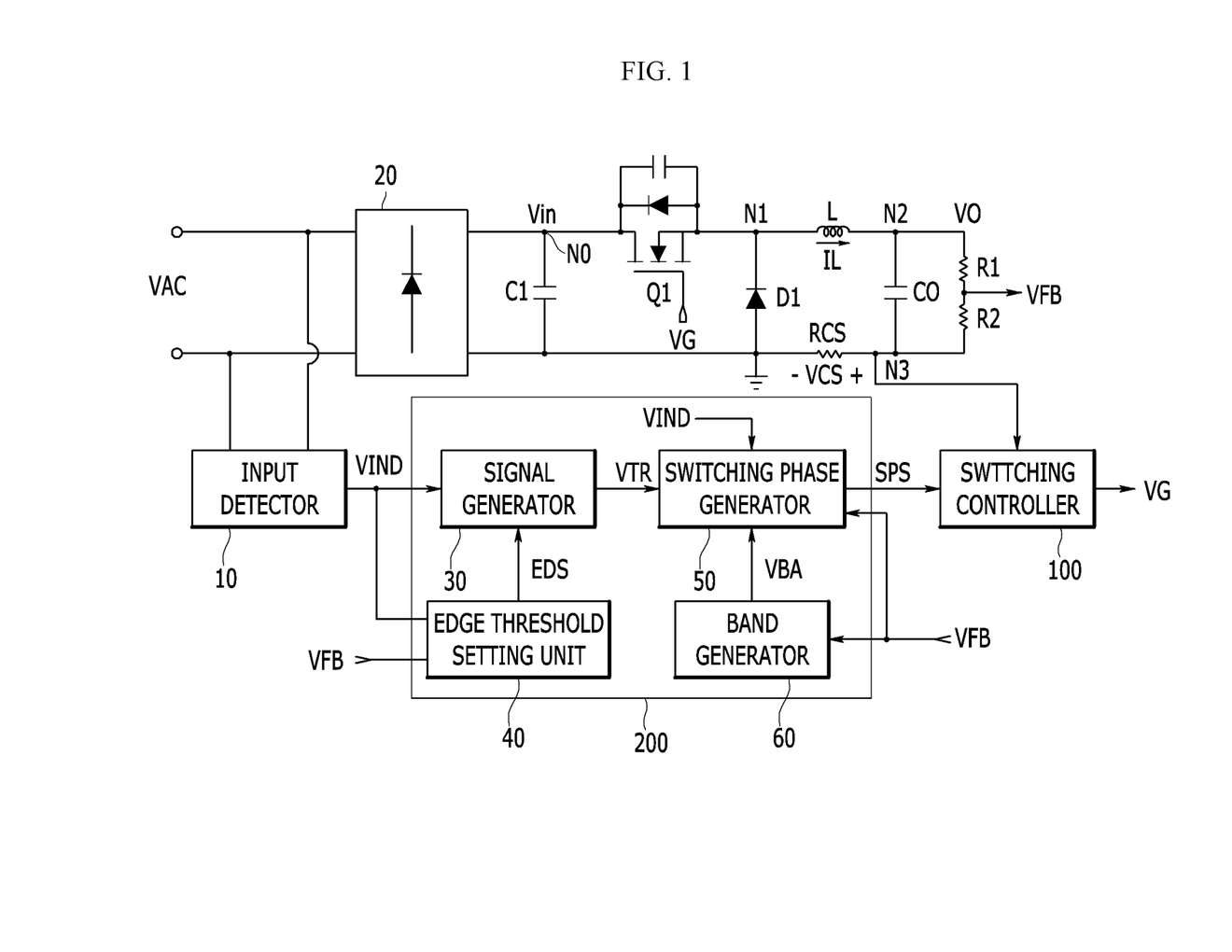
FIG. 1 is a diagram illustrating a buck converter according to an embodiment of the present invention.

FIG. 1 is a diagram illustrating a converter according to an embodiment of the present invention.

A converter 1 illustrated in FIG. 1 is a buck converter, but the present invention is not limited thereto. The embodiment may be applied to other types of converters such as a boost converter, a buck-boost converter, and the like.

As illustrated in FIG. 1, the converter 1 includes an input detector 10, a rectifier circuit 20, a signal generator 30, an edge threshold setting unit 40, a switching phase generator 50, a band generator 60, and a switching controller 100.

A burst mode control circuit 200 may include the signal generator 30, the edge threshold setting unit 40, the switching phase generator 50, and the band generator 60.

An alternating current (AC) input VAC is rectified to a line input voltage Vin through the rectifier circuit 20. Hereinafter, the line input voltage Vin is referred to as an input voltage. Noise components of the input voltage Vin may be filtered through a capacitor C1 connected to both terminals of the rectifier circuit 20.

The input detector 10 generates an input detection voltage VIND corresponding to the input voltage Vin by rectifying the AC input VAC. Unlike what is illustrated in FIG. 1, the input detector 10 may directly detect the input voltage Vin by being connected to the both terminals of the rectifier circuit 20 instead of the AC input VAC, and may generate the input detection voltage VIND.

A power switch Q1 and an inductor L are electrically connected between a node N0 to which the input voltage Vin is input and a node N2 having an output voltage VO. The input voltage Vin is input to a drain of the power switch Q1, a source of the power switch Q1 is connected to a node N1, a cathode of a diode D1 is connected to the node N1, and an anode of the diode D1 is connected to a ground.

The power switch Q1 is implemented as a metal-oxide-semiconductor field-effect transistor (MOSFET) having an N-channel type. A gate voltage VG is input to a gate of the power switch Q1, and the power switch Q1 is turned on when the gate voltage VG has a high level and is turned off when the gate voltage VG has a low level.

The inductor L is connected between the node N1 and the node N2, a capacitor CO is connected between the node N2 and a node N3, and a resistor RCS is connected between the node N3 and the ground. The output voltage VO is a voltage of both terminals of the capacitor CO.

The resistor RCS is a resistor for sensing an inductor current IL which flows to the inductor L. A voltage of the node N3, which is a voltage determined according to the inductor current IL and the resistor RCS, is referred to as a sensing voltage VCS. A resistor R1 and a resistor R2 are connected in series between the node N2 and the ground, and the output voltage VO becomes a feedback voltage VFB by being divided by the resistor R1 and the resistor R2.

The inductor current IL which flows to the inductor L during an on-period of the power switch Q1 flows to the ground through the capacitor CO and the resistor RCS. The power switch Q1 is turned off, the diode D1 becomes conductive, and thus the inductor current IL is decreased while flowing through the diode D1, the inductor L, the capacitor CO, and the resistor RCS.

The inductor current IL is controlled by a switching operation of the power switch Q1, and thus the output voltage VO may be regulated.

The switching controller 100 generates the gate voltage VG during a switching period according to a switching phase signal SPS. The switching controller 100 and the burst mode control circuit 200 consist of a switch control circuit for controlling switching of the converter 1.

The switching controller 100 supplies the gate voltage VG to a gate electrode of the power switch Q1 according to the switching phase signal SPS. The switching controller 100 may not supply the gate voltage VG under a disable level (a low level) condition of the switching phase signal SPS, and may supply the gate voltage VG under an enable level (a high level) condition of the switching phase signal SPS.

In FIG. 1, the switching controller 100 may determine a turned-on time of the power switch Q1 using the sensing voltage VCS. The on period of the power switch Q1 may be constant or may be changed according to the output voltage VO. The present invention is not limited thereto, and the switching controller 100 may generate the gate voltage VG by determining the turned-on time and a turned-off time of the power switch Q1 in various manners during an enable period of the switching phase signal SPS.

The edge threshold setting unit 40 sets edge threshold information EDS on an edge threshold voltage VED. The edge threshold setting unit 40 may determine the number of occurrences of the edge voltage VED and a position thereof as well as a level of the edge voltage VED in an edge area in consideration of at least one of a load state and the input voltage Vin. The edge threshold setting unit 40 may receive the feedback voltage VFB in order to sense the load state, and may receive the input detection voltage VIND in order to sense the input voltage Vin.

Further, the edge threshold setting unit 40 may directly sense the input voltage Vin or may use the input detection voltage VIND in order to detect the edge area. The edge area is a predetermined area adjacent to a zero-crossing point in one cycle of the input voltage Vin.

The signal generator 30 generates a signal VTR having a frequency synchronized with the input voltage Vin according to the input detection voltage VIND, and compensates for the signal VTR to control a burst mode by adding the edge threshold voltage VED to an edge area of the triangular wave VTR according to the edge threshold information EDS. The signal generator 30 may generate a triangular wave as the signal VTR, however the invention is not limited to this.

The signal generator 30 may generate the triangular wave VTR with edges, and may vary the edges of the triangular wave VTR according to the load state or the input voltage Vin. Since a burst bundle frequency according to the embodiment is controlled by an edge generation cycle of the triangular wave VTR, the burst bundle frequency may vary according to the load state.

The signal generator 30 may determine a compensation cycle and a non-compensation cycle of the triangular wave VTR according to the edge threshold information EDS. For example, in units of n cycles of the triangular wave VTR, the edge area of the triangular wave VTR may be compensated for by the edge threshold voltage VED during m cycles (compensation cycles) and the triangular wave VTR may not be compensated for during k cycles (non-compensation cycles, where n=m+k, and n, m, and k are natural numbers).

Further, the signal generator 30 may compensate for at least one of two edge areas of the triangular wave VTR by the edge threshold voltage VED in the compensation cycle according to the edge threshold information EDS.

The signal generator 30 may compensate for a level of the edge area of the triangular wave VTR corresponding to the edge threshold information EDS by using the edge threshold voltage VED.

The switching phase generator 50 determines a phase in which switching occurs according to a result of comparing the triangular wave VTR and a band voltage VBA in the burst mode. The switching phase generator 50 may generate the switching phase signal SPS according to the determined phase.

In the buck converter 1 illustrated in FIG. 1, switching occurs in a period in which the input voltage Vin is higher than the output voltage VO. The switching phase generator 50 may control the switching using the input detection voltage VIND and the feedback voltage VFB, but the present invention is not limited thereto. In a period in which the input voltage Vin is lower than the output voltage VO, even when switching occurs, power is not supplied due to the input voltage Vin. Therefore, the switching phase generator 50 may control the phase of the occurrence of switching without receiving the input detection voltage VIND and the feedback voltage VFB.

The switching phase generator 50 will be described below with reference to FIG. 2.

The band generator 60 generates the band voltage VBA based on output of the converter 1. For example, the band generator 60 generates the band voltage VBA according to the feedback voltage VFB corresponding to the output voltage VO. the band generator 60 may amplify a difference between the feedback voltage VFB and a predetermined reference voltage, perform a frequency gain compensation for the amplified result, and generate the band voltage VBA. Thus, the band voltage VBA may be decreased according to the increase of the output voltage VO, or may be increased according to the decrease of the output voltage VO.

Hereinafter, operations according to the embodiment will be described with reference to FIGS. 2 to 5.

Figure 2:
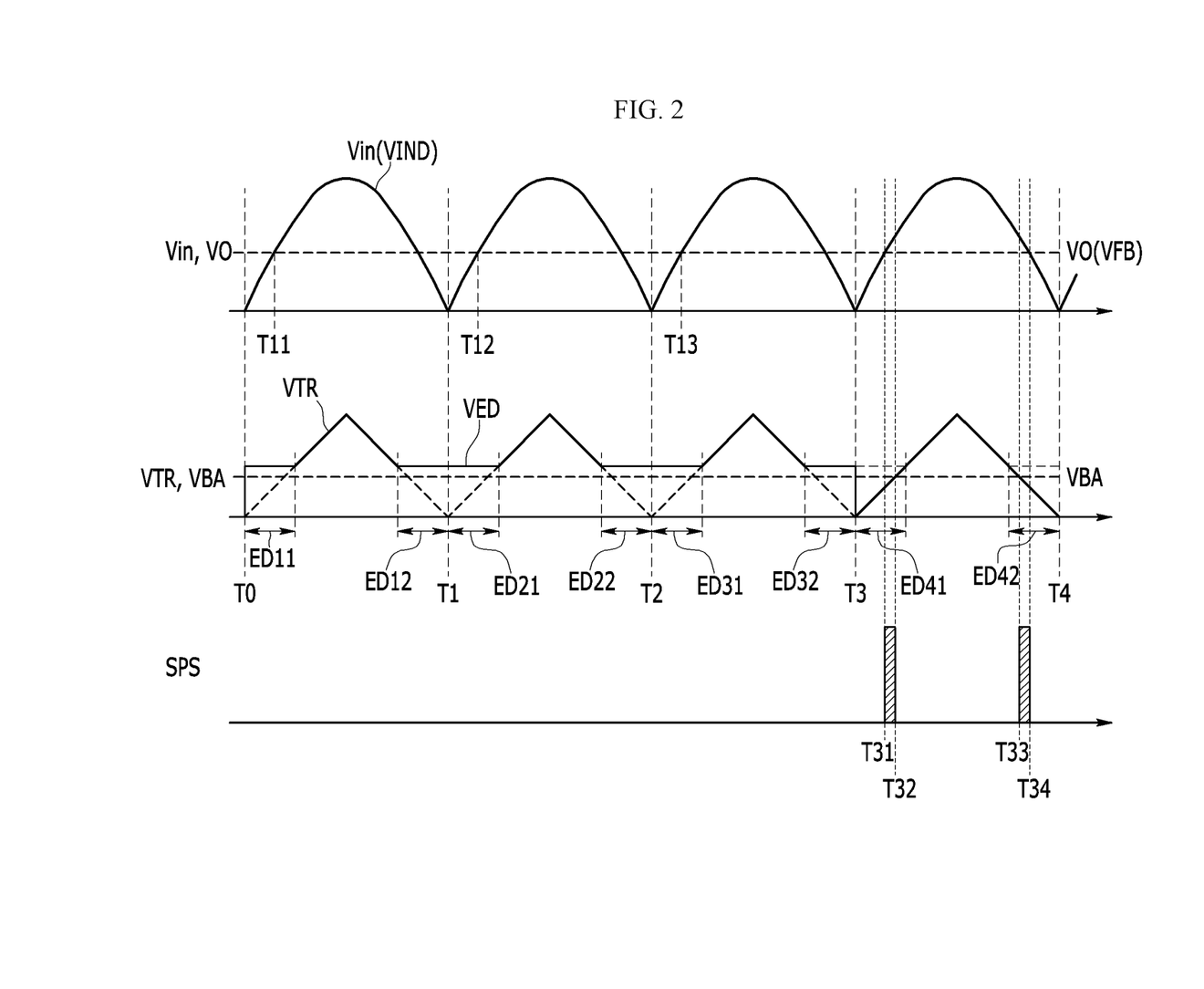
FIG. 2 is a waveform diagram illustrating an input voltage, an output voltage, a triangular wave, and a switching phase signal in a burst mode.

FIG. 2 is a waveform diagram illustrating an input voltage, an output voltage, a triangular wave, and a switching phase signal in a burst mode.

Information on each of the input voltage Vin and the output voltage VO may be obtained through the input detection voltage VIND and the feedback voltage VFB. The switching phase generator 50 according to the embodiment may compare the input detection voltage VIND with the feedback voltage VFB in order to compare the input voltage Vin with the output voltage VO.

Due to a characteristic of a buck converter, switching does not occur in a period in which the input voltage Vin is lower than the output voltage VO.

As illustrated in FIG. 2, the triangular wave VTR has a waveform compensated for by an edge threshold voltage VED in edge areas ED11 and ED12 in one cycle T0-T1 of the input voltage Vin. In the edge area ED11 adjacent to a zero-crossing time T0 and the edge area ED12 adjacent to a zero-crossing time T1, the triangular wave VTR is generated as the edge threshold voltage VED. In the next cycle T1-T2 of the input voltage Vin, the triangular wave VTR is also generated as the edge threshold voltage VED in edge areas ED21 and ED22. In the following cycle T2-T3 of the input voltage Vin, the triangular wave VTR is also generated as the edge threshold voltage VED in edge areas ED31 and ED32.

In a fourth cycle T3-T4 of the input voltage Vin, the triangular wave VTR is not compensated for by the edge threshold voltage VED in edge areas ED41 and ED42. The triangular wave VTR is increased with a constant gradient from a time T3, and is decreased with a constant gradient until a time T4 after a peak thereof.

During the three cycles T0-T1, T1-T2, and T2-T3, the band voltage VBA is lower than the edge threshold voltage VED. Therefore, the switching phase signal SPS is also maintained at a low level in a period in which the input voltage Vin is higher than the output voltage VO. In the embodiment, the switching phase generator 50 increases the switching phase signal SPS to a high level by being synchronized at a time at which the input voltage Vin is higher than the output voltage VO, and maintains the switching phase signal SPS at a high level during a period in which the triangular wave VTR is higher than the band voltage VBA.

In FIG. 2, since the band voltage VBA is lower than the edge threshold voltage VED during the three cycles T0-T1, T1-T2, and T2-T3, the switching phase signal SPS may not be maintained at a high level. Although not illustrated in FIG. 2, the switching phase signal SPS may be generated as a short pulse at times T11, T12, and T13 of the three cycles T0-T1, T1-T2, and T2-T3, but may be ignored since it is very short.

The increasing input voltage Vin reaches the output voltage VO at a time T31, and the switching phase generator 50 increases the switching phase signal SPS to a high level by being synchronized at the time T31. The increasing triangular wave VTR reaches the band voltage VBA at a time T32, and the switching phase generator 50 decreases the switching phase signal SPS to a low level by being synchronized at the time T32.

The decreasing triangular wave VTR reaches the band voltage VBA at a time T33, and the switching phase generator 50 increases the switching phase signal SPS to a high level by being synchronized at the time T33. The decreasing input voltage Vin reaches the output voltage VO at a time T34, and the switching phase generator 50 decreases the switching phase signal SPS to a low level by being synchronized at the time T34.

Then, switching occurs only in a period T31-T32 and a period T33-T34. That is, since switching occurs in units of four cycles of the input voltage Vin in the burst mode, the burst bundle frequency becomes a quarter of a frequency of the input voltage Vin.

For example, in order to set the burst bundle frequency to one-third of the frequency of the input voltage Vin, the signal generator 30 compensates for the triangular wave VTR by using the edge threshold voltage VED in the edge area in at least one cycle of three cycles of the triangular wave VTR, and does not compensate for the triangular wave VTR in the other cycles.

Further, in order to set the burst bundle frequency to half of the frequency of the input voltage Vin, the signal generator 30 compensates for the triangular wave VTR by using the edge threshold voltage VED in an edge area in one cycle of two cycles of the triangular wave VTR, and does not compensate for the triangular wave VTR in the other cycle.

Further, in order to set the burst bundle frequency to the frequency of the input voltage Vin, the signal generator 30 compensates for the triangular wave VTR by using the edge threshold voltage VED in an edge area in each cycle of the triangular wave VTR.

In FIG. 2, the triangular wave VTR is compensated for by using the edge threshold voltage VED in edge areas in three cycles of the triangular wave VTR and the triangular wave VTR is not compensated for by using the edge threshold voltage VED in an edge area in one cycle, but the present invention is not limited thereto. The triangular wave VTR may be compensated for by using the edge threshold voltage VED in edge areas in two cycles of the triangular wave VTR, and the triangular wave VTR may not be compensated for by using the edge threshold voltage VED in edge areas in the other two cycles. Alternatively, the triangular wave VTR may not be compensated for by using the edge threshold voltage VED in edge areas in three cycles of the triangular wave VTR, and the triangular wave VTR may be compensated for by using the edge threshold voltage VED in an edge area in the other one cycle.

Thus, according to the embodiment, the burst bundle frequency may be variously controlled in the burst mode.

When the switching phase generator 50 does not use information on the input voltage Vin and the output voltage VO, the switching phase generator 50 enables switching only in a period in which the triangular wave VTR is lower than the band voltage VBA in a period in which the triangular wave VTR is increased. For example, the switching phase generator 50 may enable switching during a period T3-T32 and a period T33-T4. However, as described above, power may not be supplied or switching may not occur in a period in which the input voltage Vin is lower than the output voltage VO.

In FIG. 2, the same edge threshold voltage VED is set in two edge areas during one cycle of the triangular wave VTR, but the present invention is not limited thereto. The edge threshold voltages VED in the two edge areas may be different or the triangular wave VTR may be compensated for by using the edge threshold voltage VED in only one area of two edge areas.

Figure 3:
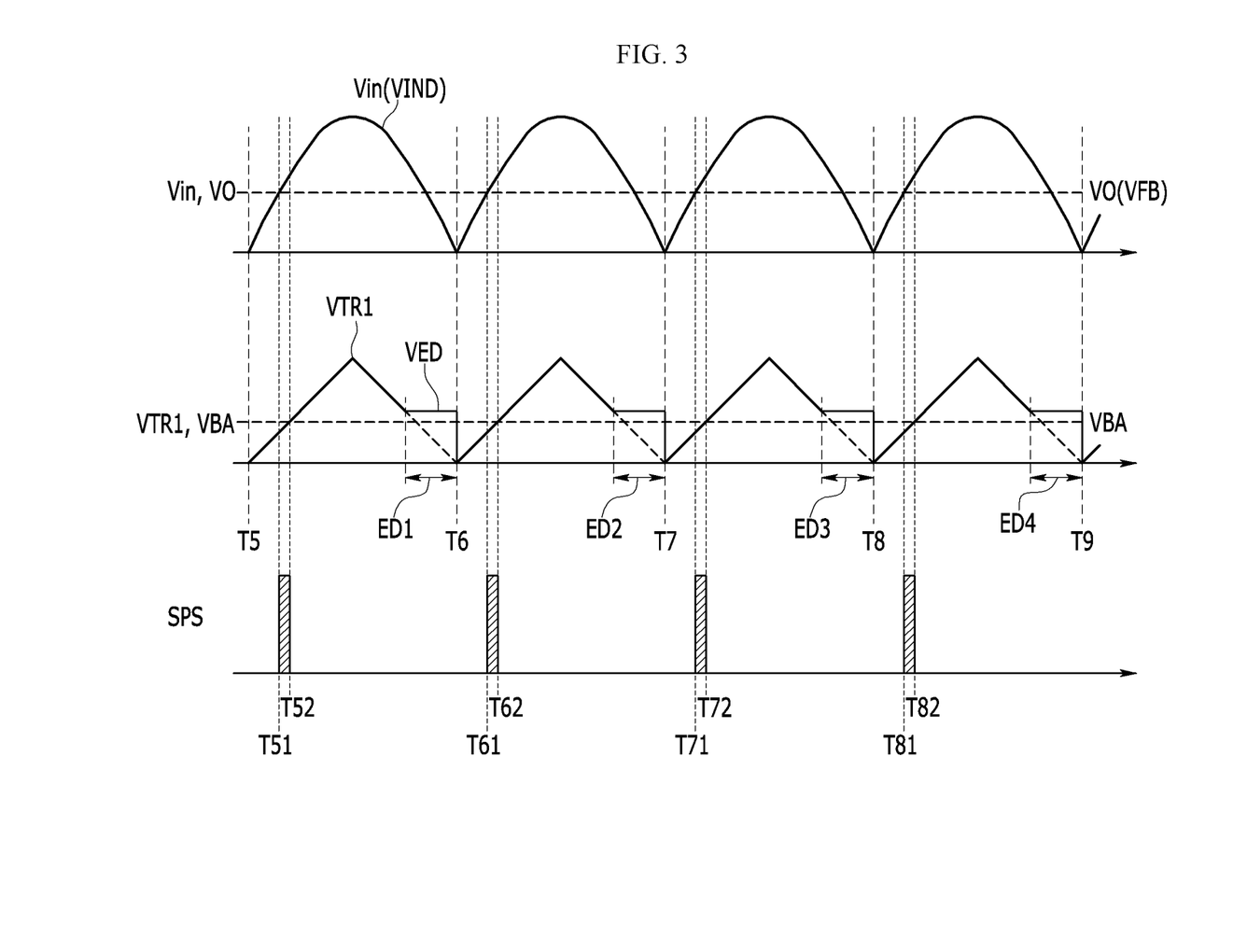
FIG. 3 is a waveform diagram illustrating a case in which a triangular wave is compensated for by an edge threshold voltage in only one area of two edge areas.

FIG. 3 is a waveform diagram illustrating a case in which a triangular wave is compensated for by an edge threshold voltage in only one area of two edge areas.

As illustrated in FIG. 3, a triangular wave VTR1 is compensated by for an edge threshold voltage VED in right edge areas ED1, ED2, ED3, and ED4 of eight edge areas.

The triangular wave VTR1 is increased from a zero-crossing time T5 of an input voltage Vin. The increasing input voltage Vin reaches an output voltage VO at a time T51, and the switching phase generator 50 increases a switching phase signal SPS to a high level by being synchronized at the time T51. The increasing triangular wave VTR1 reaches a band voltage VBA at a time T52, and the switching phase generator 50 decreases the switching phase signal SPS to a low level by being synchronized at the time T52.

In the same manner, in edge areas corresponding to each of zero-crossing times T6, T7, and T8, the switching phase signal SPS becomes a high level in a period T61-T62, a period T71-T72, and a period T81-T82, and thus switching occurs during these periods.

In a burst mode illustrated in FIG. 3, a burst bundle frequency may be the same as a frequency of the input voltage Vin, but the number of burst bundles in one cycle of the input voltage Vin is decreased to one. The burst mode illustrated in FIG. 3 is only an example for describing the embodiment, and the present invention is not limited thereto.

When one cycle of the triangular wave VTR in the period T0-T1 illustrated in FIG. 2 is inserted between two adjacent cycles of the triangular wave VTR1 illustrated in FIG. 3, the burst bundle frequency becomes half of the frequency of the input voltage Vin. When two cycles of the triangular wave VTR in the period T0-T1 are inserted between the two adjacent cycles of the triangular wave VTR1 illustrated in FIG. 3, the burst bundle frequency becomes one-third of the frequency of the input voltage Vin.

Figure 4:
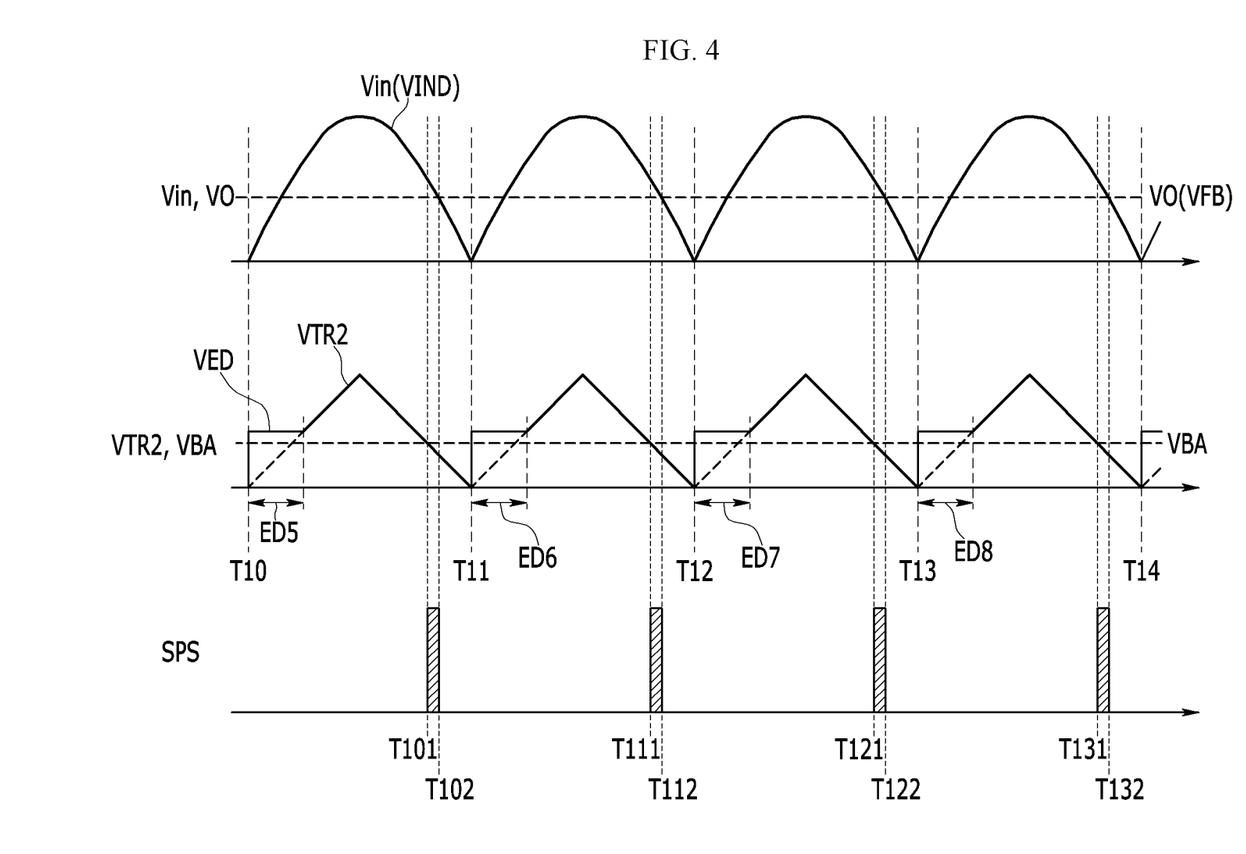
FIG. 4 is a waveform diagram illustrating a case in which a triangular wave is compensated for by an edge threshold voltage in only one area of two edge areas.

FIG. 4 is a waveform diagram illustrating a case in which a triangular wave is compensated for by an edge threshold voltage in only one area of two edge areas.

As illustrated in FIG. 4, a triangular wave VTR2 is compensated for by an edge threshold voltage VED in left edge areas ED5, ED6, ED7, and ED8 of eight edge areas.

The triangular wave VTR2 is increased to the edge threshold voltage VED at a zero-crossing time T10 of an input voltage Vin. The decreasing triangular wave VTR2 reaches a band voltage VBA at a time T101, and the switching phase generator 50 increases a switching phase signal SPS to a high level by being synchronized at the time T101. The decreasing input voltage Vin reaches an output voltage VO at a time T102, and the switching phase generator 50 decreases the switching phase signal SPS to a low level by being synchronized at the time T102.

In the same manner, in edge areas corresponding to each of zero-crossing times T11, T12, and T13, the switching phase signal SPS becomes a high level in a period T111-

T112, a period T121-T122, and a period T131-T132, and thus switching occurs during these periods.

In a burst mode illustrated in FIG. 4, a burst bundle frequency may be the same as a frequency of the input voltage Vin, but the number of burst bundles of one cycle of the input voltage Vin is decreased to one.

When one cycle of the triangular wave VTR in the period T0-T1 illustrated in FIG. 2 is inserted between two adjacent cycles of the triangular wave VTR2 illustrated in FIG. 4, the burst bundle frequency becomes half of the frequency of the input voltage Vin. When two cycles of the triangular wave VTR in the period T0-T1 are inserted between the two adjacent cycles of the triangular wave VTR2 illustrated in FIG. 4, the burst bundle frequency becomes one-third of the frequency of the input voltage Vin.

Figure 5:
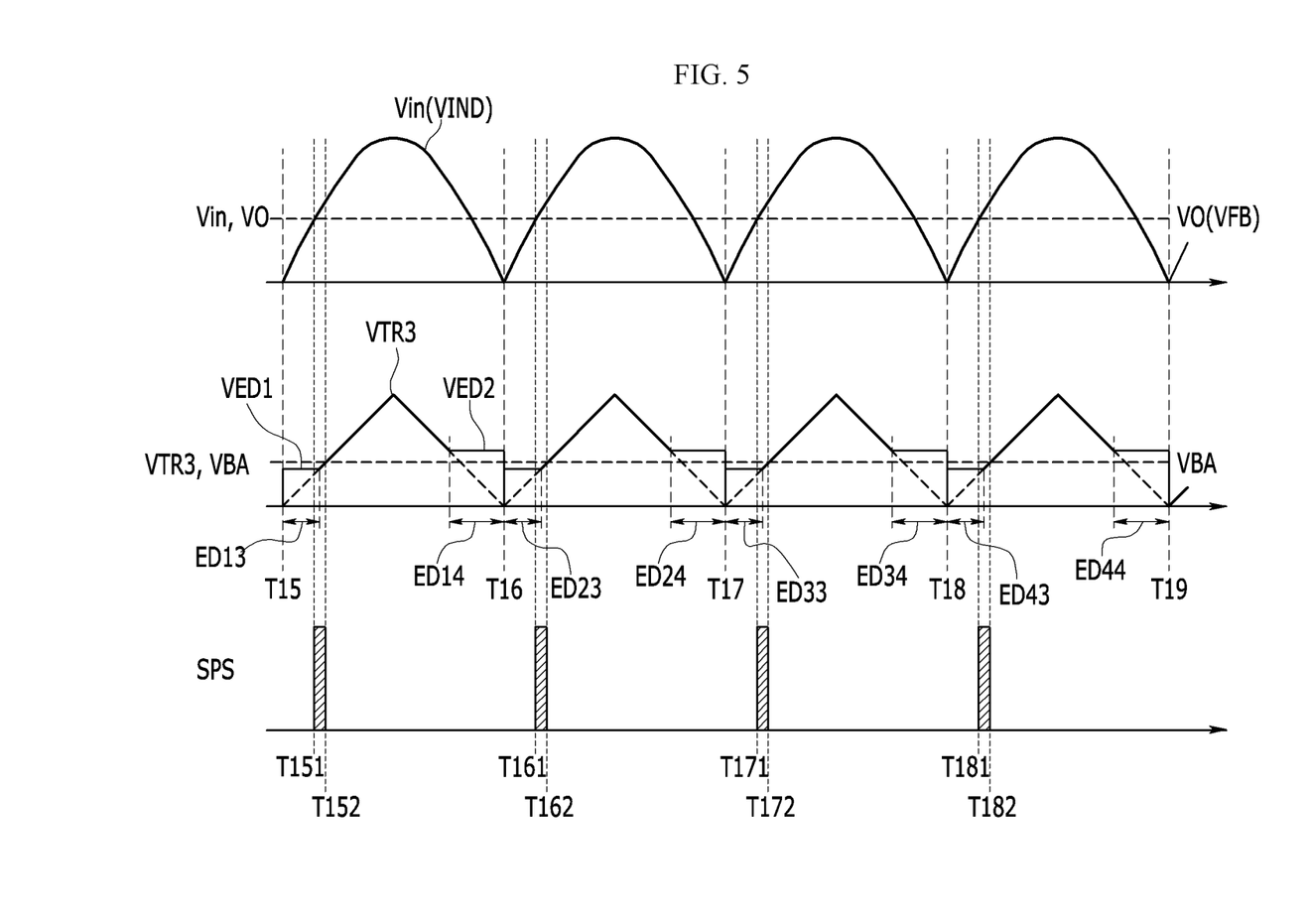
FIG. 5 is a waveform diagram illustrating a triangular wave having different edge threshold voltage levels in two edge areas.

FIG. 5 is a waveform diagram illustrating a triangular wave having different edge threshold voltage levels in two edge areas.

As illustrated in FIG. 5, an edge threshold voltage VED1 in left edge areas ED13, ED23, ED33, and ED43 of eight edge areas is different from an edge threshold voltage VED2 in right edge areas ED14, ED24, ED34, and ED44 thereof. A triangular wave VTR3 is compensated for by the different edge threshold voltages VED1 and VED2 in the left edge areas ED13, ED23, ED33, and ED43 and the right edge areas ED14, ED24, ED34, and ED44 in units of one cycle.

In FIG. 5, the edge threshold voltage VED1 is illustrated as being lower than the edge threshold voltage VED2, but the present invention is not limited thereto and may be opposite thereto.

The triangular wave VTR3 is increased to the edge threshold voltage VED1 at a zero-crossing time T15 of an input voltage Vin. The increasing input voltage Vin reaches an output voltage VO at a time T151, and the switching phase generator 50 increases a switching phase signal SPS to a high level by being synchronized at the time T151. The increasing triangular wave VTR3 reaches a band voltage VBA at a time T152, and the switching phase generator 50 decreases the switching phase signal SPS to a low level by being synchronized at the time T152.

Since the edge threshold voltage VED2 in the right edge areas ED14, ED24, ED34, and ED44 is a higher voltage than the band voltage VBA, the switching phase signal SPS is not generated.

In the same manner, the switching phase signal SPS becomes a high level in a period T161-T162, a period T171-T172, and a period T181-T182 partially overlapping the left edge areas ED23, ED33, and ED43 corresponding to each of zero-crossing times T16, T17, and T18, and switching occurs during these periods.

In a burst mode illustrated in FIG. 5, a burst bundle frequency may be the same as a frequency of the input voltage Vin, but the number of burst bundles in one cycle of the input voltage Vin is decreased to one. When one cycle of the triangular wave VTR in the period T0-T1 illustrated in FIG. 2 is inserted between two adjacent cycles of the triangular wave VTR3 illustrated in FIG. 5, the burst bundle frequency becomes half of the frequency of the input voltage Vin. When two cycles of the triangular wave VTR in the period T0-T1 are inserted between two adjacent cycles of the triangular wave VTR3 illustrated in FIG. 5, the burst bundle frequency becomes one-third of the frequency of the input voltage Vin.

In the embodiment described up to this point, the occurrence of switching is controlled by compensating for the voltage in the edge area of the triangular wave by using the edge threshold voltage in the burst mode.

However, the present invention is not limited thereto, and the switching period in the burst mode may be controlled without using the edge threshold voltage. For example, a band voltage which indicates a load state, a feedback voltage corresponding to the output voltage VO, and a triangular wave may be used. A voltage having a constant level may be used instead of the feedback voltage VFB. The corresponding voltage, which is a reference voltage compared with the band voltage VBA in order to sense the burst mode, may be set in various manners.

Figure 6:
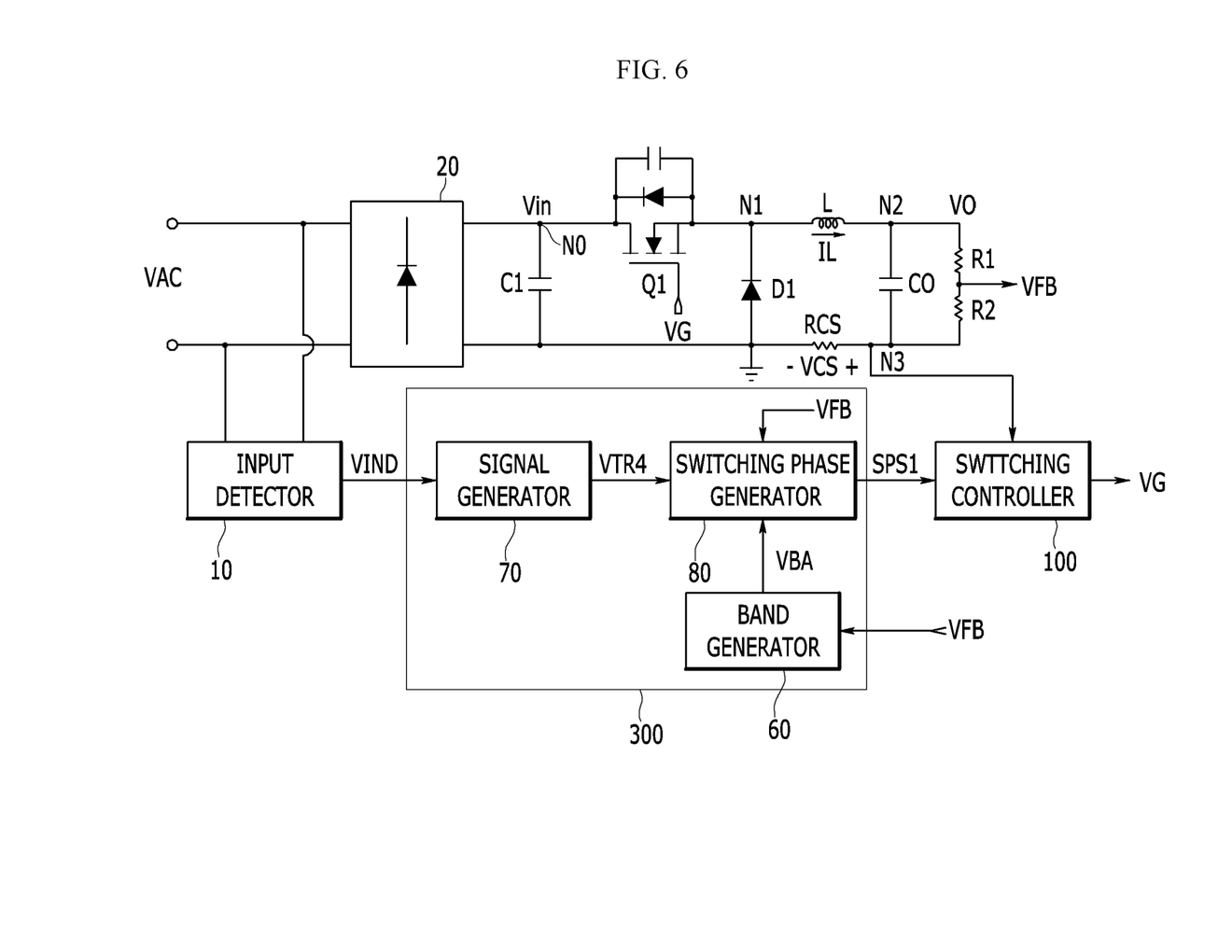
FIG. 6 is a diagram illustrating a converter according to another embodiment of the present invention.

FIG. 6 is a diagram illustrating a converter according to another embodiment of the present invention.

The same components as those in the embodiment of FIG. 1 are illustrated using the same reference numerals, and detailed description thereof will be omitted.

A band generator 60 generates a band voltage VBA based on a feedback voltage VFB. The band generator 60 is not limited thereto, and a burst mode control circuit 300 may include a signal generator 70, a switching phase generator 80, and the band generator 60 regardless of the feedback voltage VFB.

The signal generator 70 generates a triangular wave VTR4 synchronized with an input voltage Vin according to an input detection voltage VIND.

The switching phase generator 80 generates a switching phase signal SPS1 based on a predetermined blank period and a result of comparing the triangular wave VTR4 with each of the band voltage VBA and the feedback voltage VFB.

The switching phase generator 80 may control switching to occur during a period in which the triangular wave VTR4 is higher than the feedback voltage VFB and is lower than the band voltage VBA except during a blank period (hereinafter referred to as a preliminary switching period). The switching phase generator 80 may generate the switching phase signal SPS1 which indicates switching during the preliminary switching period except during the blank period.

When the band voltage VBA is decreased due to the decrease of a load, the preliminary switching period becomes smaller than the blank period, and thus switching may not occur. The switching controller 100 may not supply a gate voltage VG under a disable level (a low level) condition of the switching phase signal SPS1, and may supply the gate voltage VG under an enable level (a high level) condition of the switching phase signal SPS1.

Figure 7:
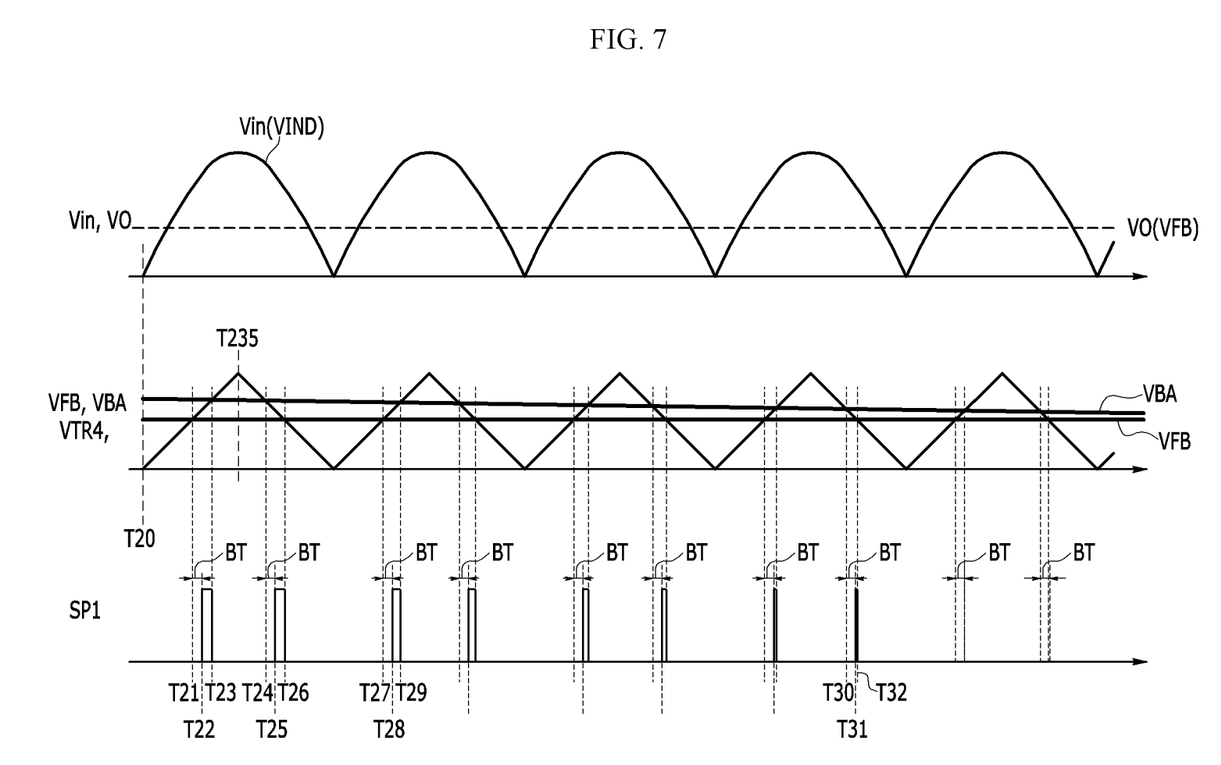
FIG. 7 is a waveform diagram illustrating an input voltage, an output voltage, a triangular wave, a comparison voltage, and a switching phase signal according to another embodiment.

FIG. 7 is a waveform diagram illustrating an input voltage, an output voltage, a triangular wave, a comparison voltage, and a switching phase signal according to another embodiment.

In FIG. 7, the band voltage VBA is illustrated as being decreased due to the decrease of the load, but this is only an example for describing the embodiment, and the present invention is not limited thereto.

The triangular wave VTR4 starts to increase from a zero-crossing time T20. The increasing triangular wave VTR4 reaches the feedback voltage VFB at a time T21. The switching phase generator 80 increases the switching phase signal SPS1 to a high level at a time T22 at which a blank period BT has elapsed from the time T21. The triangular wave VTR4 reaches the band voltage VBA at a time T23, and the switching phase generator 80 decreases the switching phase signal SPS1 to a low level.

That is, switching occurs during a period T22-T23 which is a preliminary switching period T21-T23 except during the blank period BT.

The decreasing triangular wave VTR4 reaches the band voltage VBA at a time T24. The switching phase generator 80 increases the switching phase signal SPS1 to a high level at a time T25 at which the blank period BT has elapsed from the time T24. The triangular wave VTR4 reaches the feedback voltage VFB at a time T26, and the switching phase generator 80 decreases the switching phase signal SPS1 to a low level.

In the same manner, switching occurs during a period T25-T26 which is a preliminary switching period T24-T26 except during the blank period BT.

In the next cycle, the switching phase signal SPS1 is also increased to a high level at a time T28 at which the blank period BT has elapsed from a time T27 at which the increasing triangular wave VTR4 reaches the feedback voltage VFB. The triangular wave VTR4 reaches the band voltage VBA at a time T29, and the switching phase signal SPS1 is decreased to a low level. Therefore, switching occurs during a period T28-T29 which is a preliminary switching period T27-T29 except during the blank period BT.

The decreasing triangular wave VTR4 reaches the band voltage VBA at a time T30, and the switching phase signal SPS1 is increased to a high level at a time T31 at which the blank period BT has elapsed from the time T30. The triangular wave VTR4 reaches the feedback voltage VFB at a time T32, and the switching phase signal SPS1 is decreased to a low level. The switching occurs during a period T31-T32 which is a preliminary switching period T30-T32 except during the blank period BT.

After the time T32, the blank period BT is greater than the preliminary switching period, and thus switching does not occur.

The switching phase generator 80 may not compare the band voltage VBA with the triangular wave VTR4 in the periods in which the triangular wave VTR4 is decreased, and may use information on a peak time.

For example, in FIG. 7, the switching phase generator 80 counts a period T23-T235 which is a period from the time T23 at which the triangular wave VTR4 reaches the band voltage VBA to a peak time T235 of the triangular wave VTR4. The switching phase generator 80 increases the switching phase signal SPS1 to a high level at a time (about T25) at which the blank period BT has elapsed from a time at which a period T23-T235 has elapsed from the peak time T235. Also, the switching phase generator 80 decreases the switching phase signal SPS1 to a low level at the time T26.

According to the embodiments, switching occurs in only some periods of the AC input VAC, and thus a switching loss may be minimized. Further, according to the embodiments, the burst bundle frequency is lowered in the burst mode, and thus the switching loss may be minimized.

While embodiments have been described above in detail, the scope of embodiments of the present invention is not limited thereto, but encompasses several modifications and improvements by those skilled in the art using basic concepts of embodiments of the present invention defined by the appended claims.

What is claimed is:

1. A switch control circuit for controlling switching of a converter comprising:
    a signal generator configured to generate a signal having a frequency synchronized with an input voltage of the converter, and to compensate for the signal by adjusting a level of the signal using an edge threshold voltage in an edge area of the signal according to at least one of a load state and the input voltage; and
    a switching phase generator configured to compare the signal with a band voltage that is based on an output voltage of the converter,
    wherein the switch control circuit controls the switching of the converter based on a result of the comparison of the signal with the band voltage.

2. The switch control circuit of claim 1, wherein:
    the edge area includes a left edge area and a right edge area in the one cycle of the input voltage; and
    the signal generator is configured to generate the signal as the edge threshold voltage in at least one area of the left edge area and the right edge area.

3. The switch control circuit of claim 2, wherein the signal generator is configured to generate the signal as the same edge threshold voltage in the left edge area and the right edge area.

4. The switch control circuit of claim 2, wherein the signal generator is configured to generate the signal as different edge threshold voltages in the left edge area and the right edge area.

5. The switch control circuit of claim 4, wherein at least one of the different edge threshold voltages is lower than the band voltage.

6. The switch control circuit of claim 1, wherein the signal generator is configured to compensate for the signal by using the edge threshold voltage during m compensation cycles, and does not compensate for the edge area of the signal during k non-compensation cycles, in units of n cycles of the signal, where n=m+k, and n, m, and k are natural numbers.

7. The switch control circuit of claim 6, wherein the signal generator is configured to compensate for at least one of two edge areas in cycles of the signal by using the edge threshold voltage during the m compensation cycles.

8. The switch control circuit of claim 1, wherein the switching phase generator is configured to enable a switching phase signal during a period in which the signal is lower than the band voltage.

9. The switch control circuit of claim 1, wherein the switching phase generator is configured to enable a switching phase signal during a period in which the signal is lower than the band voltage and the input voltage is higher than the output voltage of the converter.

10. The switch control circuit of claim 1, wherein the edge threshold voltage is higher than the band voltage.

11. The switch control circuit of claim 1, wherein the signal is a triangular wave.

12. A switch control circuit for controlling switching of a converter comprising:
    a signal generator configured to generate a signal having a frequency synchronized with an input voltage of the converter; and
    a switching phase generator configured to receive a feedback voltage that corresponds to an output voltage of the converter and to enable switching of the converter during a preliminary switching period except during a predetermined blank period within the preliminary switching period,
    wherein the preliminary switching period is a period during which the signal is lower than a band voltage corresponding to a difference between the feedback voltage and a predetermined voltage and during which the signal is higher than the feedback voltage.

13. The switch control circuit of claim 12, wherein the switching phase generator is configured to enable switching of the converter from a first time at which the blank period has elapsed to a second time at which the signal increases to the band voltage.

14. The switch control circuit of claim 12, wherein:
the switching phase generator is configured to enable switching of the converter from a first time at which the blank period has elapsed to a second time at which the signal decreases to the feedback voltage.

15. A converter comprising:
a power switch configured to switch to convert an input voltage into an output voltage; and
a switch control circuit configured to generate a signal having a frequency synchronized with the input voltage, compensate for the signal by adjusting a level of the signal using an edge threshold voltage in an edge area of the signal according to at least one of a load state and the input voltage, and control switching of the power switch based on a result of comparing the signal with a band voltage corresponding to the output voltage.

16. The converter of claim 15, wherein:
the edge area includes a left edge area and a right edge area in each cycle of the input voltage, and
the switch control circuit is configured to generate the signal as the edge threshold voltage in at least one area of the left edge area and the right edge area.

17. The converter of claim 16, wherein the switch control circuit is configured to generate the signal as the edge threshold voltage in the left edge area and the right edge area.

18. The converter of claim 16, wherein the switch control circuit is configured to generate the signal as different edge threshold voltages in the left edge area and the right edge area.

19. The converter of claim 18, wherein at least one of the different edge threshold voltages is lower than the band voltage.

20. The converter of claim 15, wherein the switch control circuit is configured to compensate for the signal by using the edge threshold voltage during m compensation cycles, and does not compensate for the edge area of the signal during k non-compensation cycles, in units of n cycles of the signal, where n=m+k, and n, m, and k are natural numbers.

21. The converter of claim 20, wherein the switch control circuit is configured to compensate for at least one of two edge areas in cycles of the signal by using the edge threshold voltage during the m compensation cycles.

* * * * *

UNITED STATES PATENT AND TRADEMARK OFFICE
CERTIFICATE OF CORRECTION

PATENT NO. : 9,831,777 B2  
APPLICATION NO. : 15/196483  
DATED : November 28, 2017  
INVENTOR(S) : Chenghao Jin et al.

Page 1 of 1

It is certified that error appears in the above-identified patent and that said Letters Patent is hereby corrected as shown below:

In the Claims

Claim 2, Column 12, Line 9, after "in" and before "one", delete "the"

Claim 3, Column 12, Lines 14-15, after "the" and before "edge", delete "same"

Signed and Sealed this  
Ninth Day of January, 2018

Joseph Matal  
*Performing the Functions and Duties of the*  
*Under Secretary of Commerce for Intellectual Property and*  
*Director of the United States Patent and Trademark Office*